United States Patent
Brigaud et al.

(10) Patent No.: US 8,055,236 B2
(45) Date of Patent: Nov. 8, 2011

(54) DEVICES FOR CONTROLLING AMPLIFICATION OF A SIGNAL EMITTED BY A MOBILE TERMINAL AND INCREASING THE AUTONOMY OF THE MOBILE TERMINAL

(75) Inventors: Jean Claude Brigaud, Montreuil sur Epte (FR); Mikael Pouliquen, Paris (FR); Bruno Lagoguez, Claix (FR)

(73) Assignee: Imerj, Ltd., Grand Cayman (KY)

( * ) Notice: Subject to any disclaimer, the term of this patent is extended or adjusted under 35 U.S.C. 154(b) by 22 days.

(21) Appl. No.: 12/545,110

(22) Filed: Aug. 21, 2009

(65) Prior Publication Data
US 2009/0312071 A1    Dec. 17, 2009

Related U.S. Application Data

(63) Continuation of application No. 09/941,708, filed on Aug. 30, 2001, now Pat. No. 7,593,710.

(30) Foreign Application Priority Data

Aug. 31, 2000   (FR) ...................................... 00 11120

(51) Int. Cl.
*H04B 1/16* (2006.01)

(52) U.S. Cl. .................. 455/343.5; 455/572; 455/343.1; 455/127.1

(58) Field of Classification Search .............. 455/343.5, 455/574, 127.1, 127.2, 127.3, 572, 69, 522, 455/343.1, 126, 127.5, 67.11, 115.3, 67.13; 330/129, 141
See application file for complete search history.

(56) References Cited

U.S. PATENT DOCUMENTS

| | | | |
|---|---|---|---|
| 5,214,393 A | 5/1993 | Aihara | |
| 5,334,945 A * | 8/1994 | Yokoya et al. | ............... 330/129 |
| 5,524,287 A | 6/1996 | Yokoya et al. | |
| 5,574,993 A | 11/1996 | Kobayashi et al. | |
| 5,715,527 A | 2/1998 | Horiiet et al. | |
| 5,999,829 A | 12/1999 | Chun et al. | |
| 6,038,428 A * | 3/2000 | Mizusawa et al. | ............. 455/69 |
| 6,334,050 B1 | 12/2001 | Skarby | |
| 6,580,901 B1 * | 6/2003 | Mochizuki | ................ 455/127.1 |
| 6,701,138 B2 | 3/2004 | Epperson et al. | |

FOREIGN PATENT DOCUMENTS

| | | |
|---|---|---|
| EP | 0 392 079 | 10/1990 |
| EP | 0 525 962 | 2/1993 |

* cited by examiner

*Primary Examiner* — John J Lee
(74) *Attorney, Agent, or Firm* — Marsh Fischmann & Breyfogle LLP

(57) ABSTRACT

Radiocommunication terminals are disclosed. A radiocommunication terminal includes a power supply, a power amplifier configured to receive and amplify a signal using power drawn from the power supply, and a control unit configured to control the power amplifier to amplify the signal by an amount of amplification based on a requested amount of amplification and a level of a voltage provided on an output terminal of the power supply.

13 Claims, 3 Drawing Sheets

DEVICES FOR CONTROLLING AMPLIFICATION OF A SIGNAL EMITTED BY A MOBILE TERMINAL AND INCREASING THE AUTONOMY OF THE MOBILE TERMINAL

CROSS REFERENCE TO RELATED APPLICATIONS

This application is a continuation of U.S. patent application Ser. No. 09/941,708, filed on Aug. 30, 2001, which claims priority from French Patent Application No. 00 11 120, filed on Aug. 31, 2000, which are incorporated by reference as if fully set forth.

FIELD OF INVENTION

The present invention relates to wireless terminals, such as mobile telephones, and more particularly to a devices for controlling amplification of the signal emitted by a mobile terminal and reducing the power drawn from the power supply battery of the terminal.

BACKGROUND

Mobile telephones include a power amplifier in order to be able to transmit a signal of sufficient power during calls.

To send and receive calls, each telephone must be connected continuously to a fixed terminal. The greater the distance from the telephone to the fixed terminal, the higher the power required.

According to the specifications of the Global System for Mobile communications (GSM), a terminal operating on the GSM network must be able to transmit a maximum power of 33 dBm. The maximum power can be reduced to 30.5 dBm in the event of extreme conditions, i.e. if the battery voltage is low.

Thus, if the telephone is very far away from the fixed terminal to which it is connected, the latter will cause the telephone to transmit at maximum power in order to ensure correct operation.

However, the higher the required transmitted power, the greater the amplification required in the terminal, and therefore the greater the load on the battery of the terminal. This leads to high power consumption from the battery and therefore a significant reduction in the autonomy of the telephone.

Against this background, an object of the present invention is to alleviate the above drawback by proposing a method and a device for amplifying a signal emitted by a mobile terminal and which reduce the power drawn from the battery of the terminal.

SUMMARY

To this end, according to an embodiment of the present invention, a radiocommunication terminal comprises a power supply, a power amplifier configured to receive and amplify a signal using power drawn from the power supply, and a control unit configured to control the power amplifier to amplify the signal by an amount of amplification based on a requested amount of amplification and a level of a voltage provided on an output terminal of the power supply.

According to an embodiment of the present invention, a radiocommunication terminal comprises a power supply, a power amplifier configured to receive and amplify a signal using power drawn from the power supply, a detector unit configured to determine a level of the signal amplified by the power amplifier, a comparator configured to provide an output signal based at least in part on one of the determined level of the signal and an adjusted level depending on the determined level of the signal amplified by the power amplifier, and a control unit configured to provide a control signal to adjust a level of amplification of the power amplifier based on the signal provided by the comparator.

According to an embodiment of the present invention, a radiocommunication terminal comprises a power supply, a power amplifier configured to receive and amplify a signal using power drawn from the power supply, a detector unit configured to determine a level of the signal amplified by the power amplifier, a reference voltage generating unit configured to establish a reference voltage as a function of the level of the signal amplified by the power amplifier and a level of a voltage provided on an output terminal of the power supply when the level of the signal amplified by the power amplifier is greater than a predetermined amount, a comparator configured to provide a signal representing a difference between the level of the signal amplified by the power amplifier and the reference voltage, and a control unit configured to provide a control signal to adjust a level of amplification of the power amplifier based on the signal provided by the comparator.

The invention will be better understood in the light of the following description, which relates to illustrative but non-limiting embodiments of the invention and is given with reference to the accompanying drawings.

DETAILED DESCRIPTION OF THE PREFERRED EMBODIMENTS

Figure 1:
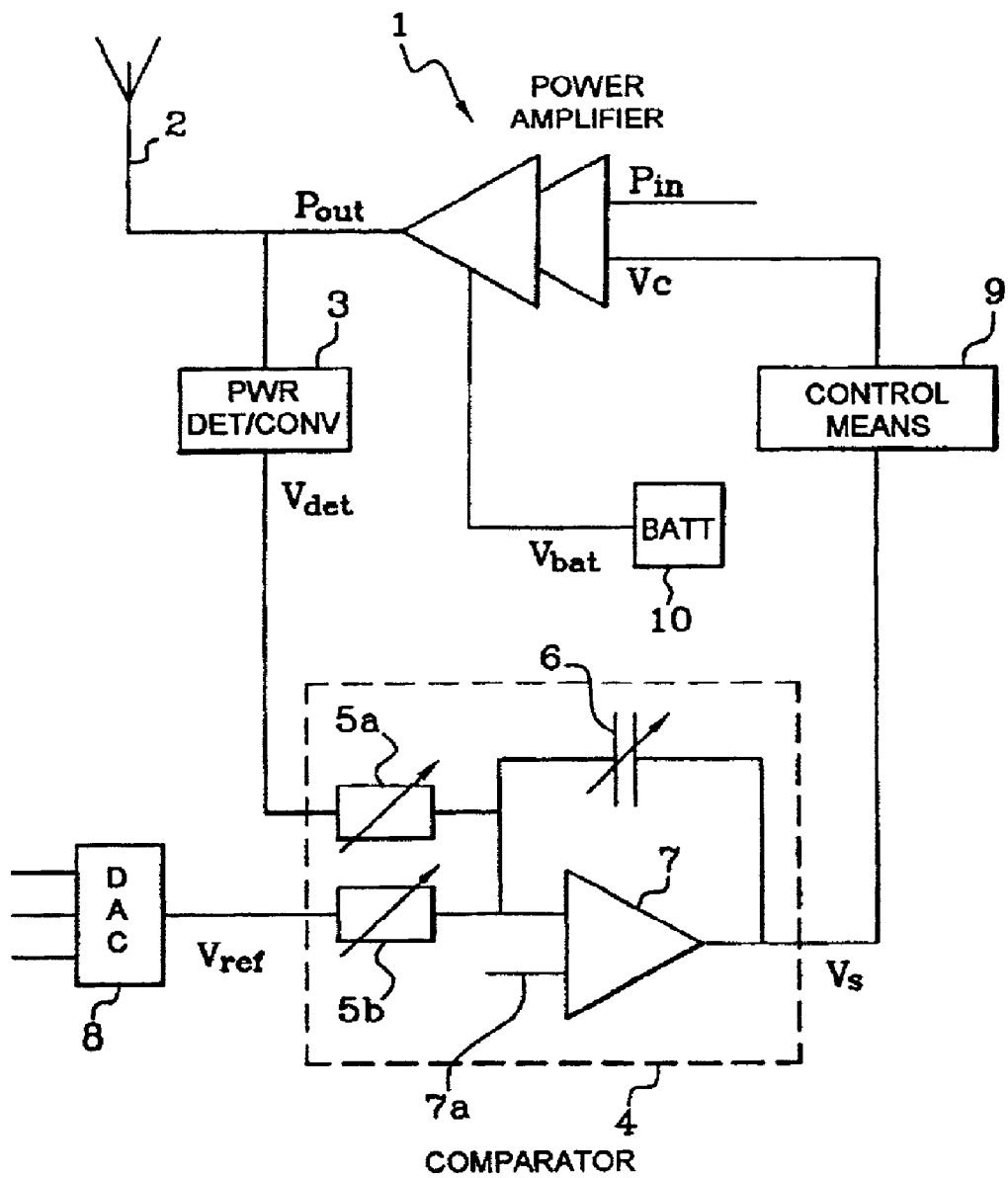
FIG. 1 is a block diagram of a device for implementing a prior art method of controlling amplification of a signal emitted by a mobile terminal.

FIG. 1 shows diagrammatically a prior art device implementing a method of controlling amplification of a signal emitted by a mobile terminal such as a mobile telephone.

The signal is amplified by a power amplifier 1 fed with a constant input power (Pin) from a preamplifier (not shown) and delivering an output power (Pout) via the antenna 2 of the mobile terminal.

The device also includes power detecting and converting means 3 at the output of the power amplifier 1. The power detecting and converting means 3 detect the output power (Pout) of the power amplifier 1 and convert it to a voltage (Vdet) corresponding to the voltage detected at the output of the power detecting and converting means 3.

The detected, output voltage (Vdet) is then fed to a comparator 4 which can be of a type known in the art.

The comparator 4 includes two variable resistors 5a, 5b whose respective resistances can be identical, a variable capacitor 6, and an operational amplifier 7, one input 7a of which is grounded.

The two inputs of the comparator 4 are therefore the detected voltage (Vdet) imaging the power (Pout) at the output of the power amplifier 1 and a set point or reference voltage (Vref) obtained in a manner known in the art from a digital/analog converter 8.

The comparator 4 delivers an output voltage (Vs) depending on the result of the comparison of (Vdet) and (Vref) to control means 9.

The control means 9 consist of a control circuit for varying the controlled voltage (Vc) at the input of the power amplifier 1 in accordance with the output voltage (Vs) of the comparator 4.

The power amplifier 1 is also connected to a power supply battery 10 delivering a voltage (Vbat).

Accordingly, the amplifier 1 draws more or less power from the power supply battery 10 according to the amplification to be applied to the signal. In the particular case where the mobile terminal is far away from the fixed terminal to which it is connected, the emitted power (Pout) must be at a maximum, i.e. at 33 dBm according to the recommendations of the GSM standard.

That maximum power required by the fixed terminal leads to high power consumption from the power supply battery 10, significantly reducing the autonomy of the mobile terminal (i.e. its talk and standby time before charging the battery).

Figure 2:
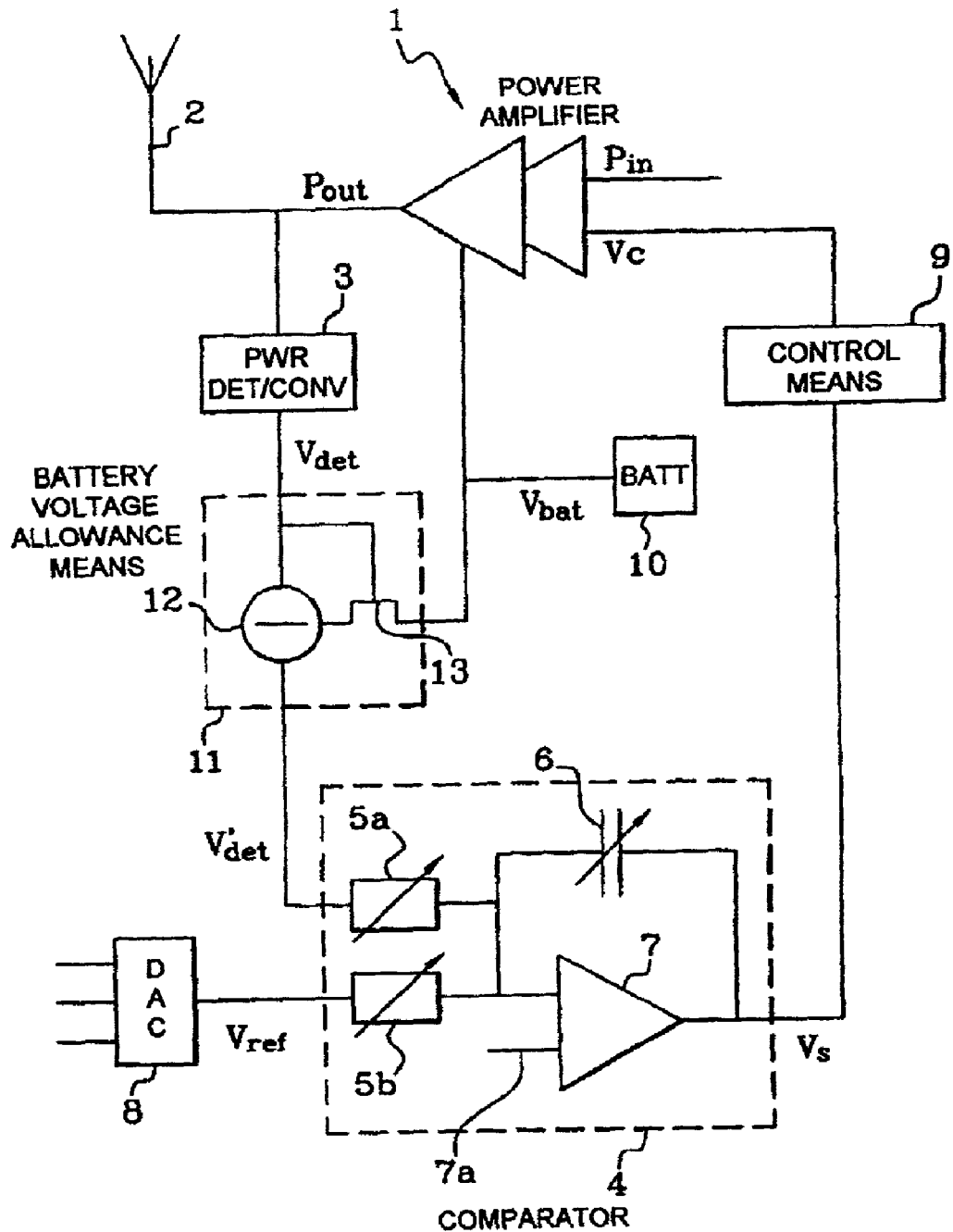
FIG. 2 is a block diagram of a first embodiment of a device for implementing a method according to the invention.

FIG. 2 is a diagrammatic representation of a first embodiment of a device for implementing a method in accordance with the invention of controlling amplification of a signal emitted by a mobile terminal.

Components in FIG. 2 identical to those of FIG. 1 retain the same reference numbers.

Thus the device includes the power amplifier 1, the detector and converter means 3, the comparator 4, the control circuit 9 and the power supply battery 10.

The essential difference compared to the prior art device concerns the detection/conversion of the output power (Pout) of the power amplifier 1.

In fact, the device according to the invention includes means 11 adapted to take account of the voltage (Vbat) of the power supply battery 10 when detecting/converting the output power of the power amplifier 1.

The means 11 include a subtractor module 12 and blocking means consisting of a field-effect transistor 13, for example. The term "blocking" means that, below a particular power threshold (Pout), the field effect transistor is not conducting and blocks the effect of the subtractor.

The subtractor module 12 and the field-effect transistor 13 are both connected to the circuit between the means 3 for detecting the output voltage of the power amplifier 1 and the input of the comparator 4.

The subtractor module 12 is configured to deliver an output voltage (V'det) such that:

$$(V'\text{det}) = (V\text{det}) - K(V\text{bat} - V\text{nom}),$$

where:

(Vdet) is the voltage detected immediately at the output of the detector means 3;

K is a positive multiplier coefficient; and (Vnom) is the nominal voltage of the power supply battery 10.

Accordingly, the lower the power supply battery voltage (Vbat), the greater the difference (Vbat)−(Vnom).

Taking account of the power supply battery voltage (Vbat) therefore reduces the difference between the set point voltage (Vref) and the voltage detected at the output of the detector and converter means 3.

Accordingly, the voltages (V'det) and (Vref) are closer together, the power amplification from (Pin) to (Pout) is lower, and there is less demand on the power supply battery 10.

Because there is less demand on the battery 10, its autonomy is increased commensurately.

According to the recommendations of the GSM standard, under certain conditions it is possible to emit a maximum power less than that specified (33 dBm), in particular if the battery voltage (Vbat) is low.

The field-effect transistor 13 renders the device operational only for a particular range of output power (Pout).

In fact, the field-effect transistor 13 is conducting (and the battery voltage (Vbat) is therefore taken into account) only for high values of the output power (Pout), for example from 30 dBm.

Thanks to this configuration, the output power (Pout) of the amplifier 1 depends on the voltage (Vbat) of the battery 10 as soon as the transistor 13 is turned on, i.e. as soon as the necessary output power (Pout) reaches a certain level.

Accordingly, for lower output powers (Pout), the transistor 13 does not conduct: the voltage (Vbat) of the power supply battery 10 is then not taken into account and the device operates in accordance with the prior art method.

Figure 3:
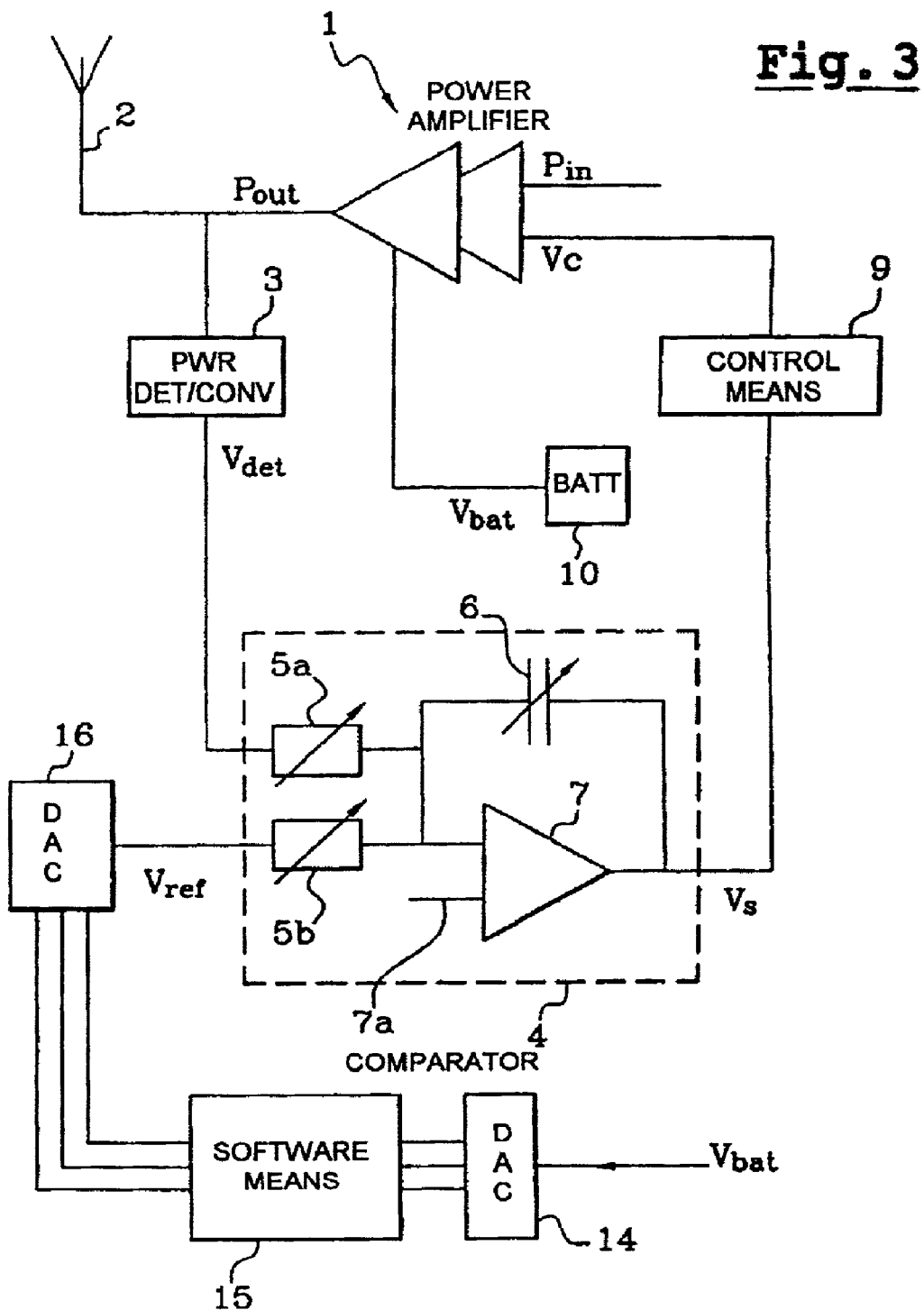
FIG. 3 is a block diagram of a second embodiment of a device for implementing a method according to the invention.

FIG. 3 is a diagrammatic representation of a second embodiment of a device for implementing a method in accordance with the invention of controlling amplification of a signal emitted by a mobile terminal.

Once again, components identical to those of FIGS. 1 and 2 retain the same reference numbers.

In FIG. 3, the voltage (Vbat) of the power supply battery is taken into account when the set point voltage (Vref) is established.

The power supply battery voltage (Vbat) is passed through a digital/analog converter 14, after which software means 15 which are known in the art employ an algorithm to establish a set point voltage (Vref) as a function of the output power level (Pout) of the amplifier 1 and the power supply battery voltage (Vbat).

In this embodiment the detected voltage (Vdet) is unchanged.

Simplifying, the algorithm employed by the software means 15 can be of the following type, for example:

If (Pout)>(Plim),

Then (Vref)'=(Vref)+K'(Vbat−Vnom), where:

(Plim) is a limit value of the output power (Pout) of the amplifier 1, chosen by the manufacturer, (Vref) is the set point voltage when the battery voltage (Vbat) is not taken into account (i.e. when (Pout)<(Plim)), K' is a positive multiplier coefficient, and (Vnom) is the nominal voltage of the power supply battery 10.

There is another digital/analog converter 16 at the output of the software means 15 to provide the voltage (Vref) or (Vref)'. The software means 15 do not actually operate on these voltages but are used to control them.

Accordingly, from a limit value (Plim) of the output power (Pout) of the amplifier 1, the set point voltage (Vref) takes a value (Vref)' depending on the battery voltage (Vbat).

Because the coefficient K' is positive, the modified voltage (Vref)' is less than (Vref), which reduces the difference between the detected voltage (Vdet) and the set point voltage (Vref)', as in the first embodiment.

Because that difference is reduced, the amplification from the input power (Pin) to the output power (Pout) is lower.

There is therefore less demand on the power supply battery 10, increasing its autonomy.

Accordingly, for high powers (for example from 30 dBm), the device takes account of the voltage (Vbat) of the power supply battery 10 in order to limit the power amplification in order to draw less power from the power supply battery 10.

Another advantage of the device and the method according to the invention is that they prevent saturation of the power amplifier 1 if the mobile terminal is relatively close to the fixed terminal to which it is connected, for example.

What is claimed is:

1. A radiocommunication terminal comprising:
   a power supply;
   a power amplifier configured to receive and amplify a signal using power drawn from the power supply; and
   a control unit configured to control the power amplifier to amplify the signal by an amount of amplification based on a requested amount of amplification and a level of a voltage provided on an output terminal of the power supply,
   the requested amount of amplification being based on a quality of a transmitted signal from the radiocommunication terminal.

2. A radiocommunication terminal comprising:
   a power supply;
   a power amplifier configured to receive and amplify a signal using power drawn from the power supply;
   a control unit configured to control the power amplifier to amplify the signal by an amount of amplification based on a requested amount of amplification and a level of a voltage provided on an output terminal of the power supply;
   a detector unit configured to determine a level of the signal amplified by the power amplifier; and
   a subtractor unit configured to determine the amount of amplification, at least in part, by subtracting from the level of the signal amplified by the power amplifier a value dependent on the level of the voltage provided on the output terminal of the power supply.

3. The radiocommunication terminal of claim 2, wherein the subtractor unit is configured to determine the amount of amplification, at least in part, by providing a calculated voltage determined by subtracting from the level of the signal amplified by the power amplifier a value determined by multiplying a positive multiplier coefficient (K) by a difference between the voltage provided on the output terminal of the power supply and a nominal voltage of the power supply.

4. The radiocommunication terminal of claim 3, further comprising a comparator configured to determine a difference between the calculated voltage and a reference voltage and to provide to the control unit a signal indicating the difference, the control unit being further configured to use the signal indicating the difference to control the power amplifier to amplify the signal by the amount of amplification.

5. A radiocommunication terminal comprising:
   a power supply;
   a power amplifier configured to receive and amplify a signal using power drawn from the power supply;
   a detector unit configured to determine a level of the signal amplified by the power amplifier;
   a comparator configured to provide an output signal based at least in part on one of the determined level of the signal and an adjusted level depending on the determined level of the signal amplified by the power amplifier; and
   a control unit configured to provide a control signal to adjust a level of amplification of the power amplifier based on the signal provided by the comparator,
   wherein the output signal from the comparator represents a difference between the one of the determined level of the signal and the adjusted level and a reference voltage.

6. A radiocommunication terminal comprising:
   a power supply;
   a power amplifier configured to receive and amplify a signal using power drawn from the power supply;
   a detector unit configured to determine a level of the signal amplified by the power amplifier;
   a comparator configured to provide an output signal based at least in part on one of the determined level of the signal and an adjusted level depending on the determined level of the signal amplified by the power amplifier;
   a control unit configured to provide a control signal to adjust a level of amplification of the power amplifier based on the signal provided by the comparator; and
   a battery voltage allowance unit configured to provide the one of the detected voltage and the adjusted voltage to the comparator depending on the determined level of the signal amplified by the power amplifier.

7. The radiocommunication terminal of claim 6, wherein the battery voltage allowance unit comprises a subtractor and a blocking unit, the subtractor being configured to subtract an amount based on a function of the level of a voltage provided on an output terminal of the power supply from the detected voltage, and the blocking unit being configured to prevent the subtractor from subtracting the amount based on the function of the level of the voltage provided on the output terminal of the power supply from the detected voltage when the level of the signal amplified by the power amplifier is greater than a predetermined voltage level.

8. The radiocommunication terminal of claim 7, wherein the blocking unit is a field effect transistor.

9. The radiocommunication terminal of claim 7, wherein the subtractor is configured to provide an output signal according to the equation $(v'det) = (vdet) - K(Vbat - Vnom)$, where (vdet) is the level of the signal amplified by the power amplifier, K is a positive multiplier coefficient, (Vbat) is the voltage provided on the output terminal of the power supply and (Vnom) is a nominal voltage rating of the power supply.

10. A radiocommunication terminal comprising:
    a power supply;
    a power amplifier configured to receive and amplify a signal using power drawn from the power supply;
    a detector unit configured to determine a level of the signal amplified by the power amplifier;
    a reference voltage generating unit configured to establish a reference voltage as a function of the level of the signal amplified by the power amplifier and a level of a voltage provided on an output terminal of the power supply when the level of the signal amplified by the power amplifier is greater than a predetermined amount;
    a comparator configured to provide a signal representing a difference between the level of the signal amplified by the power amplifier and the reference voltage; and
    a control unit configured to provide a control signal to adjust a level of amplification of the power amplifier based on the signal provided by the comparator.

11. The radiocommunication terminal of claim 10, wherein when the level of the signal amplified by the power amplifier is greater than a predetermined level, the reference voltage generating unit is configured to establish the reference voltage according to the function $(Vref') = (Vref) + K'(Vbat - Vnom)$, wherein (Vref') is the established reference voltage, (Vref) is a set point voltage when the level of the signal amplified by the power amplifier is less than the predetermined level, K' is a positive multiplier coefficient, (Vbat) is the level of the voltage provided on the output terminal of the power supply, and (Vnom) is the nominal voltage rating of the power supply.

12. The radiocommunication terminal of claim 10, wherein when the level of the signal amplified by the power amplifier is less than a predetermined level, the reference voltage generating unit establishes the reference voltage without accounting for the level of the voltage provided on the output terminal of the power supply.

13. The radiocommunication terminal of claim 10, wherein the reference voltage generating unit is a tangible computer readable medium containing software configured to establish the reference voltage.

* * * * *